United States Patent [19]

Kim et al.

[11] Patent Number: 5,706,293
[45] Date of Patent: Jan. 6, 1998

[54] METHOD OF TESTING SINGLE-ORDER ADDRESS MEMORY

[75] Inventors: Heon-cheol Kim; Ho-ryong Kim, both of Seoul; Sang-hyeon Baeg, Suwon; Chang-hyun Cho, Seongnam, all of Rep. of Korea

[73] Assignee: Samsung Electronics Co., Ltd., Suwon, Rep. of Korea

[21] Appl. No.: 650,936

[22] Filed: May 17, 1996

[30] Foreign Application Priority Data

May 18, 1995 [KR] Rep. of Korea .................. 95-12412

[51] Int. Cl.[6] ........................................... G06F 11/00
[52] U.S. Cl. ........................................ 371/21.2; 371/25.1
[58] Field of Search .................. 395/183.18; 371/27, 371/21.2, 22.4, 25.1, 26, 28

[56] References Cited

U.S. PATENT DOCUMENTS 5,258,986  11/1993  Zerbe ........................................ 371/27
5,502,814   3/1996  Yuuki et al. ......................... 395/183.18
5,513,318   4/1996  Van de Goor et al. ............. 395/183.18

Primary Examiner—Vincent P. Canney
Attorney, Agent, or Firm—Marger, Johnson, McCollom & Stolowitz, P.C.

[57] ABSTRACT

The present invention provides a test method of SOA (Single-Order Addressed) memory utilizing address data backgrounds applied to memory circuits. A memory test operation is performed using a total of $(\log_2 N+1)$ address data backgrounds on an SOA memory having N mutually different addresses. Each address data background is written and read, then the inversion is written and read. Finally the address data background is again written and read for a total of $6 N(\log_2 N+1)$ operations.

1 Claim, 3 Drawing Sheets

FIG.1

| Number of address(N) | 2 | 4 | 8 |
|---|---|---|---|
| Available ADB | 00<br>01 | 0000<br>0011<br>0101 | 00000000<br>00001111<br>00110011<br>01010101 |
| Number of ADB ($\log_2 N + 1$) | 2 | 3 | 4 |

FIG.2

| | | | |
|---|---|---|---|
| 0000 | 0000 | 0000 | 0000 |
| 0000 | 0000 | 0000 | 1111 |
| 0000 | 0000 | 1111 | 0000 |
| 0000 | 0000 | 1111 | 1111 |
| 0000 | 1111 | 0000 | 0000 |
| 0000 | 1111 | 0000 | 1111 |
| 0000 | 1111 | 1111 | 0000 |
| 0000 | 1111 | 1111 | 1111 |

METHOD OF TESTING SINGLE-ORDER ADDRESS MEMORY

BACKGROUND OF THE INVENTION

1. Field of the Invention

The present invention relates to a test method of a single-order address (SOA) memory and, more particularly, to a method of testing an SOA memory, which may be included in very large scale integrated(VLSI) circuits, that utilizes address data backgrounds (ADBs) stored in and read from the memory under test.

2. Description of the Related Art

Basic definitions of different categories of faults that can exist in memory will first be considered. Such faults include: Stuck-at faults, Transition faults, Coupling faults, and Address faults.

Stuck-at faults are those in which the value in the random cells or line logic stay constantly at 0 (or 1) and can not be changed to the opposite state. Tests to detect stuck-at faults must meet the following condition: in all cells the operation to read both a 0 and a 1 value must be executed.

Transition faults are a particular kind of stuck-at fault where a 0 to 1 (or a 1 to 0) transition of an arbitrary cell or line is not possible. Transition faults which are not influenced by other cells can be considered stuck-at faults, but it is not possible to model a transistion fault as a stuck-at fault for transition faults that occur as a result of influence by other cells. Because of this peculiar characteristic of a transition fault, the following condition must be met in tests to detect a transition fault: a minimal single 0–1 and 1–0 transition must be performed for all the cells, and a read operation must be performed after each transition.

Coupling faults occur as a result of influence by other cells. There are a variety of different coupling faults and a high degree of complication in detecting them. Because of this, they are defined under the following assumptions:
(1) A read operation does not generate faults.
(2) A non-transition write operation does not generate faults.
(3) A transition write operation can generate faults.

The above assumptions, because they reduce the number of possible situations in which coupling faults occur, facilitate the detection of coupling faults. According to the assumptions, if a write operation which generates a 0–1 or 1–0 transition in a selected cell changes the content of another cell, a coupling fault exists in both the cells.

The followings are the four different kinds of address faults:

Fault 1: A cell capable of being accessed through any address does not exist.

Fault 2: A random cell can not be accessed by any address.

Fault 3: A number of cells are accessed simultaneously by a single address.

Fault 4: A cell is accessed by a number of addresses.

The SOA march test is widely used to test SOA memories that have single-directional address schemes. The SOA march test was disclosed in "Effective March Algorithms for Testing Single-Order Addressed Memories" (Van de Goor, A. J. and Zorian Y., Journal of Electronics Testing Theory and Applications, Vol.5, No.4, pp. 337–345, Nov. 1994).

However, the SOA march testing method can only detect stuck-at faults and transition faults. It is impossible to detect all the address faults and all the coupling faults using this method.

Accordingly, Van de Goor and Zorian developed another SOA memory test method in which a test vector is added to detect coupling and address faults after the operation of the established SOA march test algorithms.

The above improved SOA memory test method was introduced in "An Effective BIST Scheme for Ring-Address Type FIFOs." (Y. Zodan, A. J. Van de Goor, and Ivo Schanstra, IEEE Int. Test Conference, Washington D.C., pp.378–387, Oct. 1994). The improved SOA memory test method that was proposed by Zodan, et al. offers a test vector of (6 N+8 N $\log_2$N) for a SOA memory with an N number of mutually different addresses.

SUMMARY OF THE INVENTION

One object of the present invention is to provide an SOA memory test method that improves the above prior art SOA memory test method by improving SOA memory test speed.

The present invention reduces test vectors by using data backgrounds between addresses. This Address Data Background(ADB) is defined as a union of all the data that two random cells having mutually different addresses can have.

The test method according to the present invention, to achieve the above object in an SOA memory that has an N number of mutually different addresses, is composed of the following steps:

The test method according to the present invention, to achieve the above object in an SOA memory that has an N number of mutually different addresses, is composed of the following steps:

(a) selecting one address data background from a group of address data backgrounds;

(b) writing the selected address data background to all of the addresses in the memory;

(c) reading data stored at each address;

(d) writing the inversion of the selected address data background to all of the addresses in the memory;

(e) reading data stored at each address;

(f) writing the selected address data background to all of the addresses in the memory;

(g) reading the data stored at each address; and (h) performing steps (b) through (g) with each of the remaining address data backgrounds in the group.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 1 is a chart explaining an address data background according to a preferred embodiment of the present invention;

FIG. 2 illustrates the address data background of FIG. 1 applied to an 8×4 memory cell.

DETAILED DESCRIPTION OF THE PREFERRED EMBODIMENT

Figure 3A:
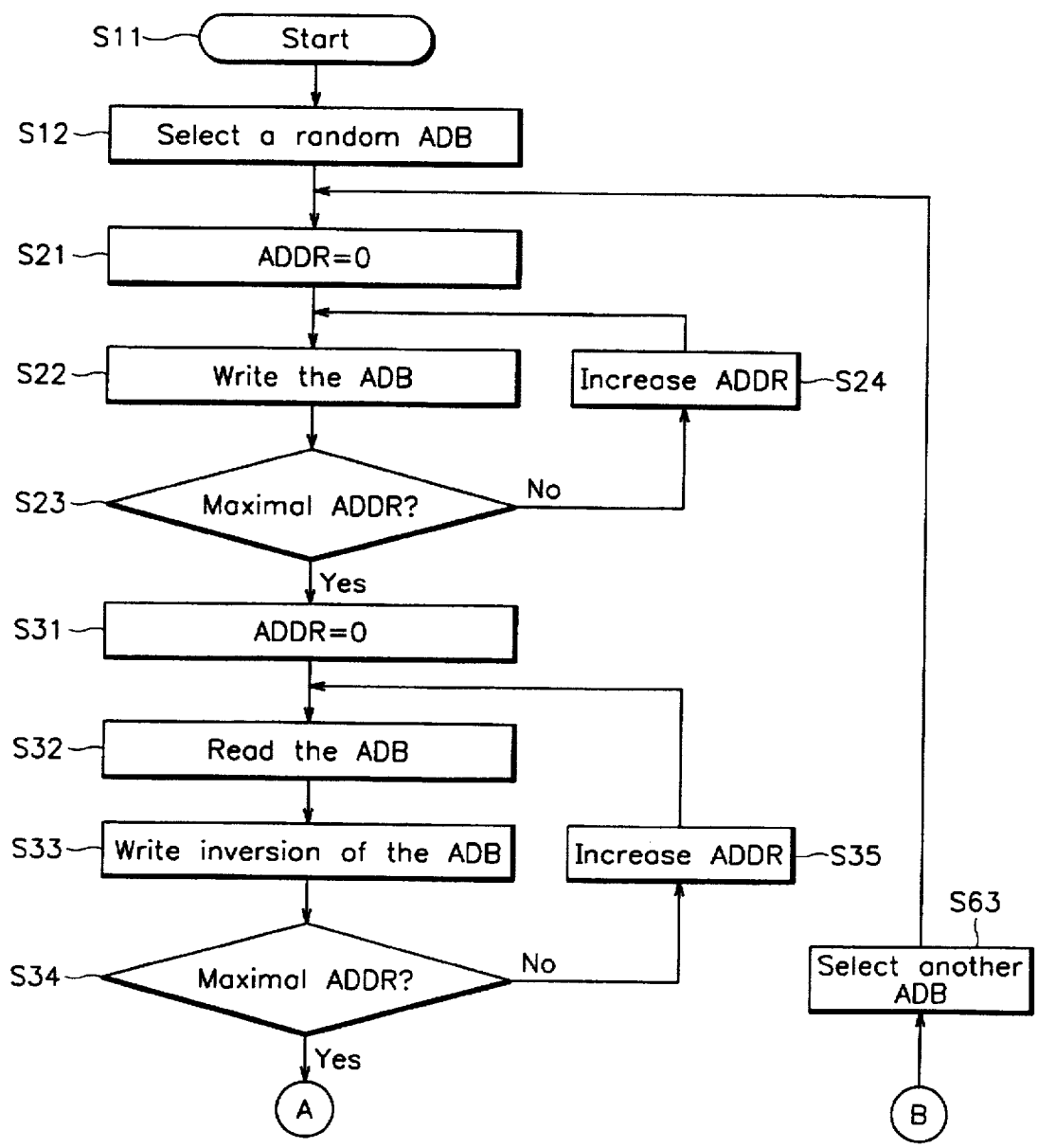
FIG. 3A & B are a sequence diagram explaining an SOA memory test method according to a preferred embodiment of the present invention.

Referring first to FIG. 1, an address data backgrounds are illustrated. If an SOA memory has N mutually different addresses, the possible number of address data backgrounds is ($\log_2$N+1).

For example as shown in FIG. 1, when there are '2' addresses, the address data backgrounds are '00' and '01';

when there are '4' addresses, the address data backgrounds are '0000', '0011', and '0101'; and when there are '8' addresses, the address data backgrounds are '0000000', '00001111', '00110011', and '01010101'.

The address data background is similar to the existing Data Background concept.

In FIG. 2, the data each address has when applying SOA memory address data backgrounds where there are 8 mutually different addresses is shown progressing from left to right. In FIG. 2, the illustrated SOA memory has a capacity of 8×4 bits, and there are 4 bits in each cell.

The above SOA memory, as it has 8 mutually different addresses, has $\log_2 8+1=4$ address data backgrounds. In the first state of the memory, depicted in the first column of FIG. 2, the address data background '0000000' is shown with cells designated by all 8 addresses each having a '0' state.

In the second state of the memory, depicted in the second column of FIG. 2, the address data background '00001111' is shown. Cells designated by the first 4 addresses are recorded as '0000', and cells designated by the last 4 addresses are recorded as '1111'.

In the third state of the memory, depicted in the third column of FIG. 2, the address data background '00110011' is shown. Addresses in units of 2 are alternated with recordings of '0000' and '1111'.

In the fourth state of the memory, depicted in the fourth column of FIG. 2, the address data background '01010101' is shown. Every address is alternated with recordings of '0000' and '1111'.

Figure 3B:
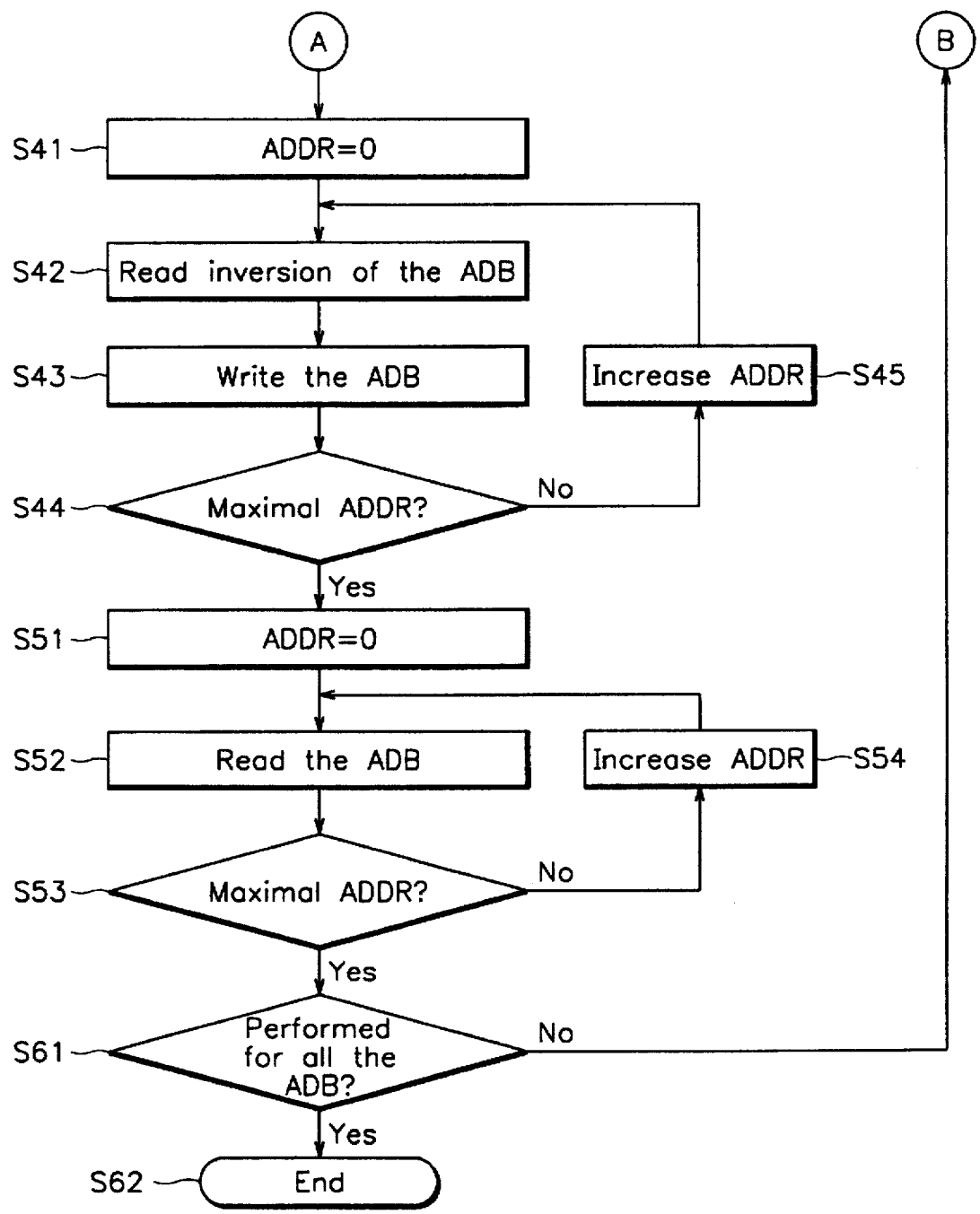

Next, while viewing FIG. 3, the aforementioned SOA memory test method using address data backgrounds will be explained. ADDR refers to a memory cell address and ADB is an address data background. Also, 'read' is used here to mean the operation of reading data from a memory cell and 'write' means the operation of writing data to a memory cell.

When the test operation is started (S11), a single address data background, out of all the possible ADBs, is selected from the SOA memory which has N mutually different addresses (S12). If supposing, as is illustrated in FIG. 1, the SOA memory being tested has 8 mutually different addresses, address data background '00001111' may be chosen from among all of the address data backgrounds, although any other of the address data backgrounds would work equally well to commence the test.

Next, the memory cell address is designated as '0', the initial memory cell address, (S21) and a write operation of the chosen address data background is performed on the addressed memory cell (S22). The write operation of the chosen address data background is conducted in steps (S23) and (S24) until the memory cell maximal address is attained. That is to say, in step (S23), whether the present memory cell address is the last addressable cell is determined, and if it is not, the memory cell address is increased in step (S24). After the maximal ADDR is reached, each memory cell, starting from the first addresses, is written in order '0','0','0','0','1', '1','1','1' as depicted in the second column of FIG. 1.

In the above step (S24), after the address data background write operation is performed until the maximal memory cell address is reached (i.e., the entire ADB is loaded into the memory), the memory cell address is again designated as '0' (S31).

Next, after the address data background (stored in the designated memory cell) read operation is executed (S32), an inverted address data background memory cell write operation is performed on each bit of the selected address data background (S33) in response to steps (S34) and (S35), which perform the operations of steps (S32) and (S33) on all the memory cells.

After steps (S34) and (S35), for the address data background '00001111' discussed above in connection with steps (S21–S24), the memory cells should be in state '1','1','1', '1','0','0','0','0'.

In step (S34), when the operation is executed until the maximal address is reached, the memory cell address is designated as '0' (S41).

Next, the designated memory cell read operation is performed (S42), and a write operation is performed on the address data background (S43). The operations in the steps (S42) and (S43) are repeated in steps (S44) and (S45) until the memory cell maximal address is reached.

For address data background '00001111' described above in steps (S21–S24), after the inverted address background stored in each memory cell is read and written in steps (S42) and (S43), the memory cells have the state '0', '0', '0', '0','1', '1', '1', '1', i.e., the memory is in the state depicted in column 2 of FIG. 2. After this operation is performed, the memory address is designated as '0' (S51).

Next, the address data background (saved in the memory cells) read operation is performed (S52), and the address data background read operations in steps (S53) and (S54), by which memory cell maximal address is reached, are repeatedly performed.

In step (S53), when the address data background read operation is performed until the memory cell maximal address is reached, it is determined whether the operations in steps (S21 to S53) have been executed for all the data backgrounds (S61). In the case where the SOA memory has 8 mutually different addresses step (S61) determines whether the steps from step (S21) to step (S54) have been performed for all the address data backgrounds, namely '0000000', '00001111', '00110011', and '01010101'.

In step (S61), if the test operations for all the address data backgrounds have not been performed, after another address data background is selected (S62), all the processes starting from step (S21) are repeated. When tests have been run for all address data backgrounds, the SOA memory test operation is completed.

As mentioned above, in accordance with a preferred embodiment of the present invention, as the memory test operation is applied with ($\log_2 n+1$) number of address data backgrounds, the number of test vectors created is 6 N×($\log_2 N+1$).

Consequently, because test vectors for the SOA memory test method of the present invention are smaller than test vectors (6 N+8 N $\log_2 N$) of the SOA memory test method proposed by Van de Goor and Zorian, testing time is reduced and the creation of hardware is simplified.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

We claim:

1. A method of testing a single-order address memory having N memory cells and N mutually different addresses in the memory, said method comprising:
   (a) creating a plurality of test vectors each having N bits of data, where M is the number of consecutive bits in each vector having the same state, including:

(1) defining a first vector in which each bit is 0;
(2) defining another vector in which the first M2 bits in each group of M bits in the previously defined vector is set to 0 and the second group of M2 bits in each group is set to 1; and
(3) repeating step (2) until $\log_2 N+1$ vectors are created;

(b) selecting one of the vectors;

(c) writing the selected vector into each memory cell, including:
  writing the first bit of the selected vector into each location of a first one of said memory cells; and
  writing each successive bit of the selected vector into each location of a different one of said memory cells;

(d) reading data stored at each address;

(e) writing the inversion of the selected vector into each memory cell, including:
  writing the first bit of the inversion of the selected vector into each location of the first one of said memory cells; and
  writing each successive bit of the inversion of the selected vector into each location of a different one of said memory cells;

(f) reading data stored at each address;

(g) writing the selected vector into each memory cell;

(h) reading data stored at each address; and (i) performing steps (c) through (h) with each of the remaining test vectors.

* * * * *

UNITED STATES PATENT AND TRADEMARK OFFICE
CERTIFICATE OF CORRECTION

PATENT NO. : 5,706,293
DATED : January 6, 1998
INVENTOR(S) : Kim et al.

It is certified that error appears in the above-identified patent and that said Letters Patent is hereby corrected as shown below:

Column 2,
Lines 5 and 8, "Zodan" should read -- Zorian --.

Column 3,
Lines 3 and 15, "0000000" should read -- 00000000 --.

Column 5,
Lines 2 and 4, "M2" should read -- M/2 --.

Signed and Sealed this

Tenth Day of December, 2002

JAMES E. ROGAN
*Director of the United States Patent and Trademark Office*